United States Patent [19]
Chuh et al.

[11] Patent Number: 5,652,586
[45] Date of Patent: Jul. 29, 1997

[54] CHARGE INTEGRATING-TYPE ANALOG TO DIGITAL CONVERTER EMPLOYING RAPID CHARGE NEUTRALIZATION AND N-BIT FEEDBACK

[75] Inventors: Thomas Y. Chuh, Vista, Calif.; Arthur L. Morse, Cottage Grove, Oreg.

[73] Assignee: Hughes Aircraft Company, Los Angeles, Calif.

[21] Appl. No.: 406,238

[22] Filed: Mar. 17, 1995

[51] Int. Cl.$^6$ .................................................. H03M 1/00
[52] U.S. Cl. .......................... 341/172; 341/169; 341/155
[58] Field of Search .................................. 341/172, 166, 341/169, 157, 155

[56] References Cited

U.S. PATENT DOCUMENTS

| | | | |
|---|---|---|---|
| 3,967,270 | 6/1976 | Anderson | 340/347 |
| 4,366,468 | 12/1982 | Yoneyama | 340/347 |
| 5,101,206 | 3/1992 | Riedel | 341/156 |

*Primary Examiner*—Jeffrey A. Gaffin
*Assistant Examiner*—Peguy JeanPierre
*Attorney, Agent, or Firm*—Mary E. Lachman; Michael W. Sales; Wanda K. Denson-Low

[57] ABSTRACT

A Sigma Rho A/D converter (10) includes a transconductance element (R) having an input node for receiving an input voltage signal $V_{in}$ and an output node providing an analog current $I_{in}$; a charge integrator (12) having an input coupled to the output node, the charge integrator having feedback provided by an integrating capacitor C and an output node providing an output signal $V_o$; and a clocked voltage comparator (14) having an input coupled to $V_o$ for comparing $V_o$ to a reference potential. An output of the comparator updates in response to an occurrence of a first clock signal CLK1. A current sink (16) is switchably coupled to the output node of the transconductance element as a function of the logic state of the output of the comparator. A sum and dump accumulator (18) has an input coupled to the output of the comparator and an output having N output bits, and operates to sum together individual ones of first logic states and outputs a sum value on the N output bits in response to an occurrence of a second clock signal CLK2. The frequency of CLK2 is equal to CLK1/N. A unique bit stream is output from the comparator (14) for each allowed input voltage such that complete information about the input voltage is embedded within, or encoded by, the bit stream output from the comparator.

26 Claims, 6 Drawing Sheets

CHARGE INTEGRATING-TYPE ANALOG TO DIGITAL CONVERTER EMPLOYING RAPID CHARGE NEUTRALIZATION AND N-BIT FEEDBACK

FIELD OF THE INVENTION

This invention relates generally to analog to digital converters and signal conversion techniques.

BACKGROUND OF THE INVENTION

A number of different analog-to-digital (A/D) converter types are known in the prior art. These include the dual ramp or slope A/D, also known as an integrating A/D; the successive approximation A/D; the tracking (counter-comparator) A/D; and the multi-comparator or flash A/D. For completeness, the voltage to frequency converter, when used with a frequency counter, may also be considered as a type of A/D converter.

Each of the foregoing A/D converter types exhibits certain advantages and also certain disadvantages. For example, the dual slope A/D is a relatively low power and inexpensive device, although it is also relatively slow compared to the other types. The successive approximation A/D can exhibit high speed conversion, although high resolution can be achieved only with precision voltage comparators and, hence, considerable expense. The tracking A/D is also a high speed device, but is known to be susceptible to noise. The flash A/D generally exhibits the fastest conversion speed, but is also expensive to implement when high resolution is required.

In general, when high accuracy and resolution is required all of these A/D converter types require the use of precision voltage comparators and associated circuitry. This requirement increases both the complexity and expense of the conversion circuit.

Monotonicity is one important operating characteristic of an A/D converter, and refers to an ability of the A/D converter to convert a linearly increasing analog input signal without exhibiting missing or erroneous digital values or codes at the output.

Other operating characteristics of an A/D converter that become important when it is desired to integrate one or more A/D converters into an integrated circuit assembly include the operating power and the manufacturability of the circuit.

For example, when it is desired to integrate an A/D converter into a readout integrated circuit for use with a focal plane array (FPA) of radiation detectors, such as a one or two dimensional FPA of infrared (IR) detectors, the power consumption (and heat dissipation) become important because the FPA must typically be cooled to, and maintained at, cryogenic temperatures during operation. As such, it is desirable that the A/D converter not add significantly to the heat load of the overall imaging system. Any additional heat load is reflected in more power being required in the cryogenic cooler, in addition to an increase in the weight and size of the cryogenic cooler.

Manufacturability is also an important concern for this application in order to reduce fabrication and testing costs. For example, the parallel type of A/D converter typically employs a tapped resistor network and an array of comparators. However, in order to achieve, by example, ten bit accuracy, as many as 1024 matched precision resistors and 1023 high-speed comparators, in addition to a fast logic array to decode the outputs of the comparators, may be required. As can be realized, the integration of such a complex circuit, with its required precision components, would not be cost effective for many applications.

Furthermore, inherent limitations in the foregoing A/D types include a fixed resolution that is set by the number of output bits, and an output error that results from rounding off the digital output to the nearest least significant bit (LSB). This latter limitation prevents the extraction of any additional bit resolution from the output data stream.

SUMMARY OF THE INVENTION

The foregoing and other problems are overcome through the use of a novel A/D converter that is constructed and operated in accordance with this invention. The A/D converter of this invention is similar in some respects to a charge-integrating type of A/D, such as the dual slope, but converts charge information into a digital output in a unique fashion. Specifically, the A/D of this invention generates a digital data stream that is a record of a rapid neutralization of charge representing an input voltage. The digital data stream is then analyzed to derive a digital representation of the magnitude of the input voltage.

The A/D converter of this invention is shown to exhibit both high resolution and high speed, while consuming a small amount of power, and to be especially useful in a multiplexed data application, such as that used for FPAs where high resolution and low power operation are typically important system considerations. The A/D converter of this invention has an inherent simplicity that makes it highly manufacturable and also readily integratable with other circuitry.

All existing A/D converters known to the inventors, that approach the performance of the A/D converter of this invention, rely on high precision components, such as voltage comparators, that are also required to be extremely stable over time. This demand on voltage comparator performance adversely impacts the cost, yield, reliability, stability, power requirements, and size of the A/D circuit.

In contradistinction to these conventional A/D converters, the A/D converter of this invention relies on the readily measured parameters of time and current, similar to the well-known dual slope approach, while also employing rapid charge neutralization and single-bit or multiple-bit negative feedback to simultaneously obtain both high resolution and high speed. Unlike circuitry that is required to implement precision voltage comparators, circuitry to measure time and current is typically much less complex and more readily implemented.

Further in accordance with this invention, the A/D converter has a externally controllable output resolution. That is, the resolution is not predetermined during design, but rather the resolution can be changed at anytime by a simple timing adjustment.

Further in accordance with this invention, the A/D converter has a "decimatable output". That is, the output alternates between two values with a duty cycle that provides information on additional bit resolution. As a result, by analyzing the output fluctuation of an N-bit A/D converter of this invention more than N bits of resolution can be obtained. In this regard, and excluding component non-idealities, information to deduce the input value to any higher bit resolution is possible to achieve. That is, unlike other types of A/D converters where the output data cannot be further analyzed to obtain higher resolution, the A/D converter of this invention preserves all of the input information during the conversion process.

An important aspect of this invention is the use of frequent charge neutralization to provide high gain with low noise.

In addition to the foregoing advantages, two or more A/D converters of this invention can be cascaded to distribute the conversion task, thereby increasing speed. This aspect of the invention is made possible because a residual charge typically exists after a conversion cycle, and this residual charge can be processed by subsequent A/D converter stages for additional accuracy.

Furthermore, because the A/D converter of this invention is not sub-ranging and is inherently monotonic, it is not susceptible to common monotonicity errors arising from voltage comparator inaccuracies.

The A/D converter of this invention also integrates the input signal which thus substantially eliminates noise folding and aliasing related to discrete sampling techniques.

When used in a FPA application, the inherent low power dissipation allows the A/D conversion function to be located near to or upon the focal plane itself, thereby reducing noise, overall system weight and power consumption. Furthermore, the commandable resolution simplifies FPA digital signal processing to realize further power and weight savings. In addition, and because the A/D converter is more manufacturable (due at least in part to an elimination of precision voltage comparator requirements), a cost advantage is realized over other A/D converter approaches.

A Sigma Rho A/D converter in accordance with this invention includes a transconductance element (R) having an input node for receiving an input voltage signal $V_{in}$ and an output node providing an analog current $I_{in}$; a charge integrator having an input coupled to the output node, the charge integrator having feedback provided by an integrating capacitor C and an output node providing an output signal $V_o$; and a clocked voltage comparator having an input coupled to $V_o$ for comparing $V_o$ to a reference potential. An output of the comparator updates in response to an occurrence of a first clock signal CLK1. A current sink is switchably coupled to the output node of the transconductance element as a function of the logic state of the output of the comparator. A sum and dump accumulator has an input coupled to the output of the comparator and an output having N output bits, and operates to sum together individual ones of first logic states and to output a sum value on the N output bits in response to an occurrence of a second clock signal CLK2. The frequency of CLK2 is equal to CLK1/N. A unique bit stream is output from the comparator for each allowed input voltage such that complete information about the input voltage is embedded within, or encoded by, the bit stream output from the comparator.

BRIEF DESCRIPTION OF THE DRAWINGS

The above set forth and other features of the invention are made more apparent in the ensuing Detailed Description of the Invention when read in conjunction with the attached Drawing, wherein:

FIG. 3b illustrates the output bit stream for the N=8 accumulation of FIG. 3a;

FIG. 6b is a waveform timing diagram showing the output of the integrator for a 2-bit feedback analog-to-digital converter in accordance with FIG. 6a;

DETAILED DESCRIPTION OF THE INVENTION

The A/D converter of this invention may be referred to as a "Sigma Rho" converter, a designation obtained from the Greek letters for "s" and "r". The "s" and "r" signify that a Summation of intermediate digital values is performed to obtain a final result, and that a Residual charge typically exists after conversion which may be analyzed to obtain additional bits of resolution. As will become apparent, the Sigma Rho A/D converter operates by a fast charge neutralization technique, wherein a digital answer or result is derived by maintaining a record of the charge neutralization activity.

The basic principles of operation are now described with reference to a one stage/one-bit feedback Sigma Rho A/D converter 10 depicted in FIG. 1.

The Sigma Rho A/D converter 10 includes a transconductance element, such as a resistor R, that converts an input voltage ($V_{in}$) into an analog current ($I_{in}$); a charge integrator (INT) embodied as an amplifier 12 having feedback provided by an integrating capacitor C; a clocked voltage comparator (COMP) 14 that compares the output of the integrator amplifier 12 to a reference potential; a gated precision current sink (SW and current sink 16); a clocked sum and dump accumulator (SDA) digital circuit 18 having N output bits; and a divide by N digital clock circuit (20, 22, and 24) that provides CLK1 and a delayed, and divided by N, CLK2 to the COMP 14 and SDA 18, respectively.

Component values and the allowed input voltage range are chosen such that $I_{in}$ can only be less than $I_{sink}$. As a result, the INT 12 integrates up (more positive) when the current sink 16 is on (SW is closed), and integrates down (more negative) when the current sink 16 is off (SW open as illustrated). The state of SW is controlled by the output of COMP 14, which in turn is controlled by the magnitude of the integration ramp at the output of the INT 12. The comparator 14 need not be a precision device and, as will be explained below, can exhibit any offset and need not have a precise trip point. It is only important that the operation of the comparator 14 be stable over time.

For this example, let $0<V_{in}<1$ volt, $I_{sink}=1$ mA, and $R=1K\Omega$; then the possible values of $I_{in}$ are $0<I_{in}<1$ mA ($=I_{sink}$).

As but one example, $V_{in}$ may be output from a radiation detector or from a radiation detector readout circuit associated with an FPA (not shown), and the output of the SDA 18 may be connected to a signal processor (not shown) that reads in the conversion values, and which shifts a decimal point to average same as described below.

Gating of the current sink 16, via SW, is controlled by the clocked voltage comparator 14. By design, the current sink 16 is off when the output of the comparator 14 is low (0 volts, for example), and the current sink 16 is on when the output of the comparator 14 is high (1 volt, for example). The state of the clocked comparator 14 can be changed only by the rising edge of CLK1. The rising edge of CLK1 is defined herein as a "clock tick."

To summarize, when the output $V_o$ of the INT 12 is <0 at a clock tick, the output of the comparator 14 is set high and the current sink 16 turned on; and when $V_o$>0 at a clock tick, the output of the comparator 14 is set low and the current sink 16 turned off.

Figure 2:
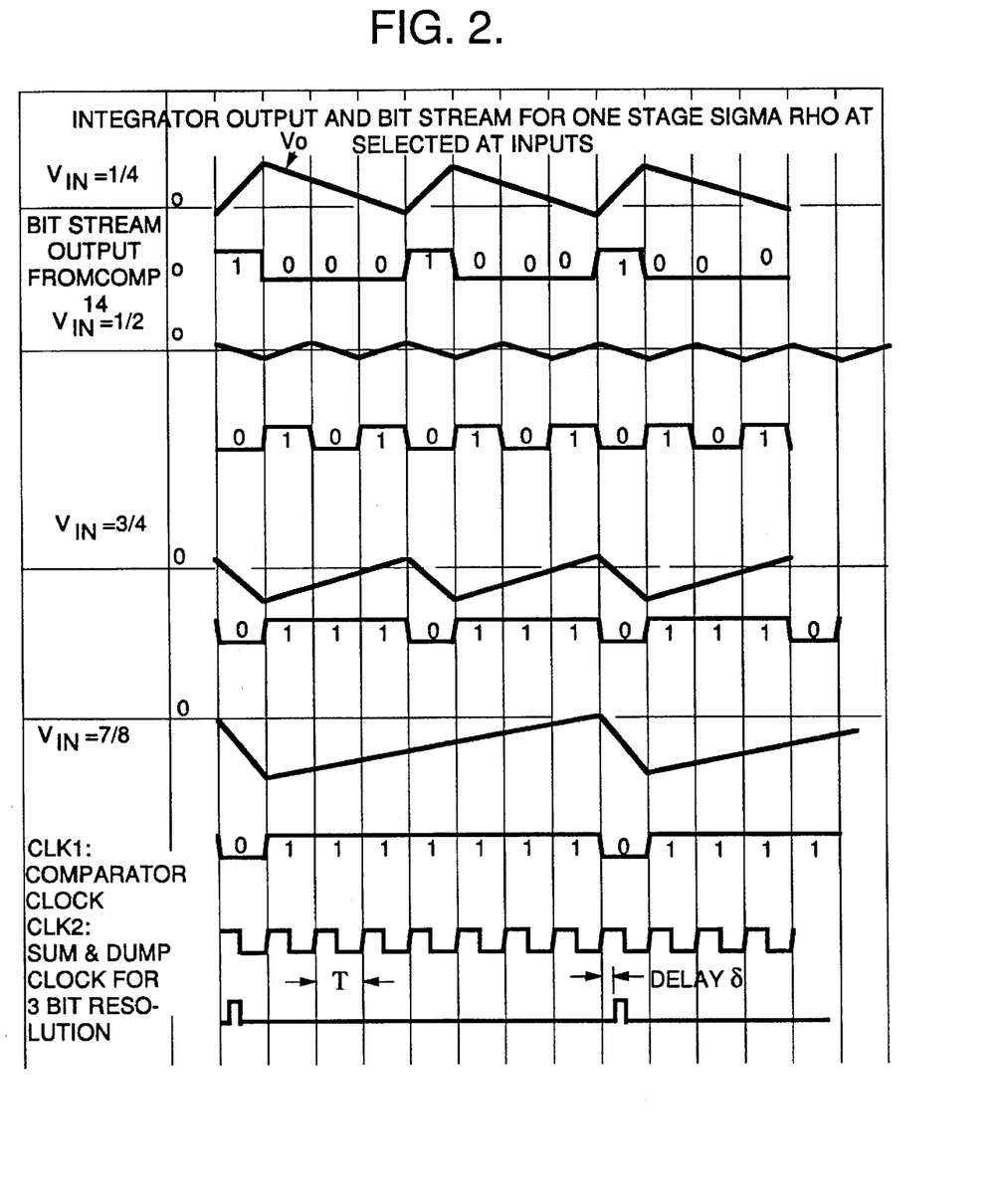
FIG. 2 is a waveform timing diagram showing the integrator and comparator outputs of FIG. 1 for four different input voltages.

The comparator 14 and gated current sink 16 together comprise a negative feedback circuit for the integrator 12. This feedback loop causes the integration direction to alternate as illustrated in FIG. 2 for selected input voltages. The phases of CLK1 and CLK2 are also shown.

Regardless of the specific input voltage, it is apparent from FIG. 2 that the output waveform of the integrator 12 exhibits the following features: 1) the restoring leg of the integration is one CLK1 period long; 2) the period and amplitude of the integrator waveform is smallest for Vin=0.5 (midpoint of the allowed input range) and grows larger as $V_{in}$ approaches 0 or 1 volt (limits of the allowed input range); and 3) the maximum amplitude that may occur is given by $V_o=(I_{sink} * T)/C$, where T is the period of CLK1, and C is the capacitance connected across the integrator 12. In other words, $C=(I_{sink} * T)/V_{o-max}$.

It is further apparent from FIG. 2 that, as a result of the negative feedback loop, a unique bit stream is output from the comparator 14 for each allowed input voltage. In other words, complete information about the input voltage is embedded within, or encoded by, the bit stream output from the comparator 14.

The output bit stream is herein defined as consisting of repeating "cycles," with each cycle consisting of comparator 14 "updates". By example, and for the $V_{in}$=¼ case in FIG. 2, the repeating cycle is "1000", which consists of the four updates "1, 0, 0 and 0."

The Sigma Rho converter 10 derives a digital answer or output value by averaging the digital bit stream that is output from the comparator 14. In this regard it is pointed out that the average of the bit values of the bit stream over one complete cycle yields the exact input voltage value. For example, the $V_{in}$=¼ case in FIG. 2 exhibits a cycle of "1" followed by three "0's", and this averages to 0.25, or ¼.

It is important to note that the accuracy of the Sigma Rho converter 10 does not depend upon the precise control of the charge that is integrated, but rather upon the precise measurement of the charge that is integrated. In other words, the switching of the current sink 16 need not be precisely timed, so long as each switching event is properly recorded in the bit stream.

The SDA circuit 18 functions to average the bit stream to derive the digital answer. To illustrate, let N=8 for the cases illustrated in FIG. 2. The SDA 18 accumulates (that is, sums) eight updates of the stream, and after a delay (δ) it receives a pulse on CLK2 commanding the SDA 18 to output the result, and then reset before the next CLK1 clock tick when the next conversion begins. The delay (δ) is inserted to avoid a race condition that may be caused by the changing input of the SDA 18 at a clock tick. For N such that N=2,4,8,... , the sum obtained is converted to the desired average by moving the decimal point of the sum to the left $\log_2(N)$ bit positions. This effectively divides the sum. The following is a demonstration of digital answers derived by this method.

Figure 1:
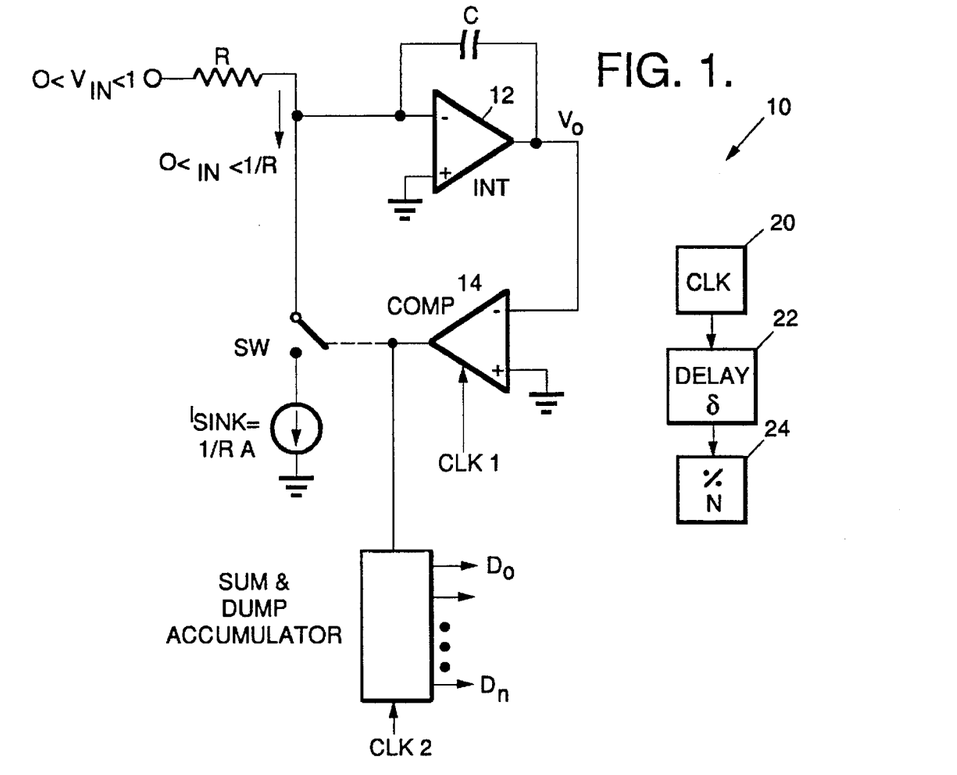
FIG. 1 is a schematic diagram of a single stage, one bit feedback A/D convertor in accordance with this invention, the A/D convertor comprising an integrator and a comparator.

For the SDA circuit 18 of FIG. 1, and for N=8 and for $V_{in}$=¼, the bit stream output by the comparator 14 is given by: 10001000.

Summing the individual bits of the bit stream with one another yields 010, or 2, and moving the decimal $\log_2(8)$=3 bit positions to the left gives the 3-bit answer of 0.010. Other examples of this technique are as follows.

| $V_{in}$ | BIT STREAM | SUM | AVERAGE ≡ ANSWER |
|---|---|---|---|
| 1/2 | 10101010 | 100 | .100 |
| 3/4 | 11101110 | 110 | .110 |
| 7/8 | 11111110 | 111 | .111 |

Figure 3A:
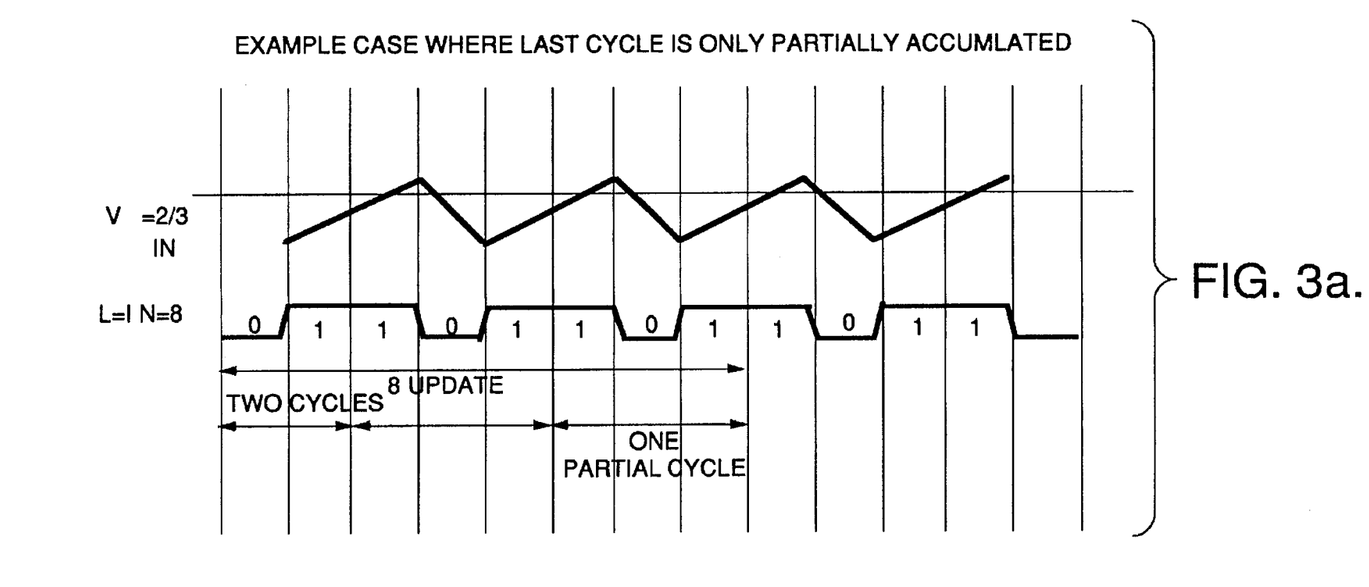
FIG. 3a is a waveform timing diagram showing an exemplary case wherein a last conversion cycle is only partially accumulated.
Figure 3B:
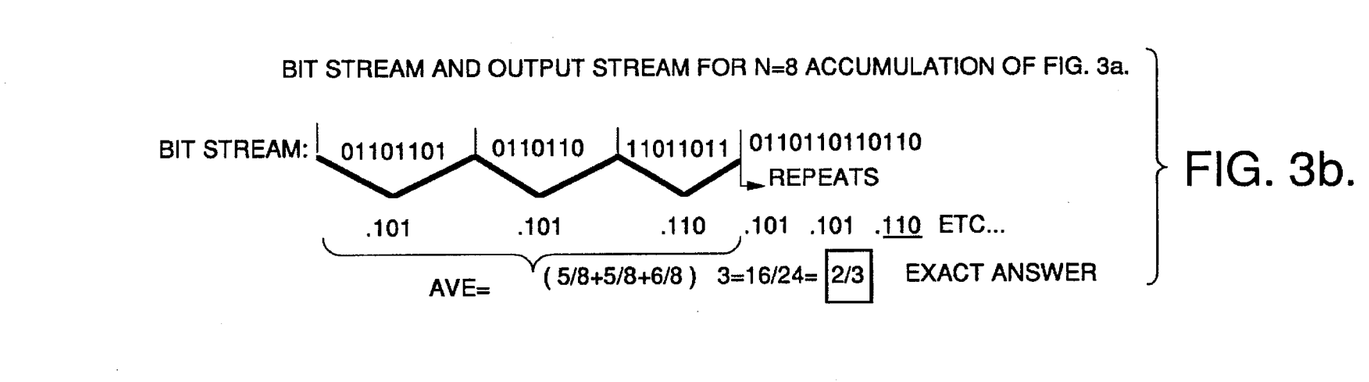

In the foregoing description of the basic operation of the A/D converter 10 the input voltages for the examples in FIG. 2 were selected such that complete cycles of the bit stream would be accumulated, although in general this is not the case. More typically, partial cycles are accumulated as shown in FIG. 3a for the example $V_{in}$=⅔ and N=8. As illustrated, two complete cycles and one partial cycle are accumulated for the eight updates "011 011 01". The effect of these partial cycles is that the stream of output answers from the SDA 18 fluctuates in a repeating pattern, as shown in FIG. 3b.

In one sense, this fluctuation in the values output by the SDA 18 would represent an uncertainty if only a single answer were observed. That is, if only 0.101 were observed in this example, it could not be determined if the fluctuation was between 0.110 to 0.101, or between 0.101 to 0.110. As a result, the overall uncertainty is two LSBs.

However, if the output fluctuation is averaged over time, the uncertainty is eliminated. FIG. 3b shows that the average of the output fluctuation over one complete cycle yields the exact answer. That is, $$(\tfrac{5}{8}+\tfrac{5}{8}+\tfrac{6}{8})/3=\tfrac{16}{24}=\tfrac{2}{3},$$

which is the exact answer.

This feature, referred to herein as a "decimatable output", makes possible system architectures wherein both frequent, low resolution answers and less frequent, high resolution answers are acquired simultaneously.

For example, in an FPA data acquisition system lower resolution values may be transmitted off-chip at a high rate, and an answer of higher resolution reconstructed as needed in an associated signal processor. This feature may be employed for gamma, or noise, circumvention, wherein corrupted low resolution values, due to the presence of ionizing radiation, can be identified and discarded.

That is, and assuming that eight bit resolution is desired, only four signal lines for conveying four bits need be brought out of the FPA assembly to external electronics where the increased resolution is derived. In that each signal line that exits the FPA assembly adds to the cryogenic cooler load, this enables a significant reduction in overall system power requirements.

Figure 4:
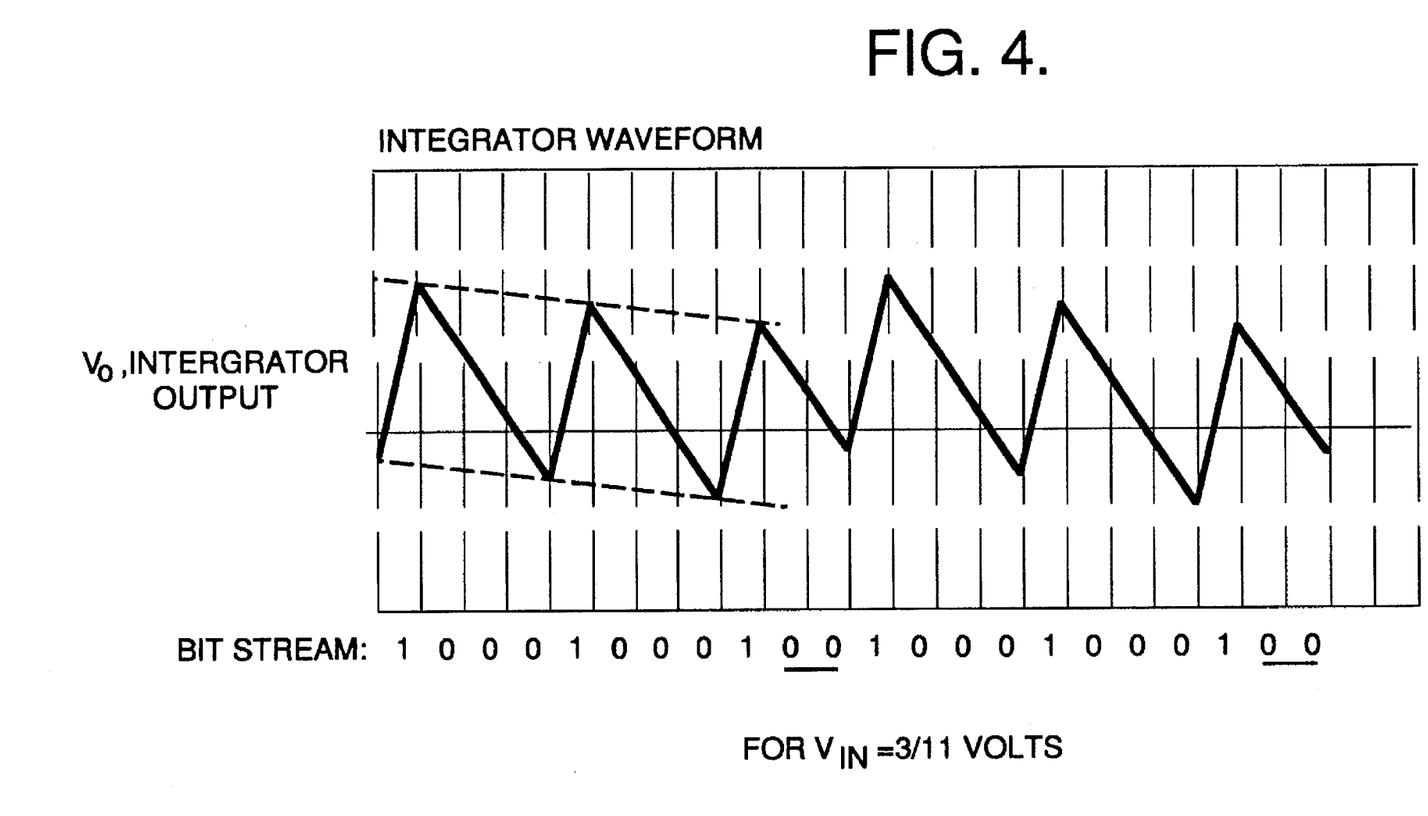
FIG. 4 is a waveform timing diagram illustrating a complex bit stream and the corresponding output of the integrator of FIG. 1.

As is also apparent from the examples illustrated in FIG. 2; the bit streams are all simple repeating patterns. However, in practice this is not typically the case. As illustrated in FIG. 4, the bit stream may contain missing or extra 1's and/or 0's (missing 0 in this example) that occur in a rhythmic pattern. Along with this behavior, an upward or downward shift in the peaks and valleys of the integrator output waveform may also occur. The extra 1's or 0's are caused by the gradual accumulation of un-neutralized charge in the integrator 12 that is periodically cancelled. A gradual skew occurs in the zero-crossing of the integrator 18 output waveform until the state of the comparator 14 is reversed one clock tick late (or early).

Another useful alternative interpretation of this behavior is the extra 1's or 0's represent the mechanism by which the bit pattern changes from one simple pattern to another simple pattern as the input voltage varies. For example, listed below are the bit streams for selected values between $V_{in}=1/2$ to $V_{in}=2/3$.

| $V_{in}$ | Stream | Cycle |
|---|---|---|
| 1/2 | 10101010... etc... | 10 |
| 5/9 | 110101010110101010... | 110101010 = Group A |
| 4/7 | 111010101101010... | 1101010 = Group B |
| 3/5 | 1101011010... | 11010 |
| 5/8 | 10110110010110110... | 10110110 |
| 7/11 | 10110110110101101110110... etc... | 10110110110 |
| 2/3 | 110110110... | 110 |

It should be noted that the relative frequency of the 10 and 110 patterns changes as the voltage changes.

The transition between intermediate values such as 5/9 and 4/7 occurs in the same manner. If bit patterns are defined as "Group A" and "Group B", as shown above, the change in bit stream from $V_{in}=5/9$ to $V_{in}=4/7$ is represented by:

| $V_{in}$ | Stream | |
|---|---|---|
| 5/9 | AAA... etc... | A |
| | BAAABAAA... | BAAA |
| | BAABAA... | BAA |
| [(4/7)−(5/9)]/2 | ABAB... | AB |
| | ABBABB... | ABB |
| | ABBBABBB... etc... | ABBB |
| 4/7 | BB... | B |

In accordance with an aspect of this invention, this nesting of "patterns within patterns" allows any input value to be represented by a unique repeating bit stream pattern.

A further aspect of the Sigma Rho A/D 10 of this invention is a commandable resolution. That is, the resolution can be changed at any time by changing the value of N (the CLK2 divider value).

By example, a consideration is made of the bit stream generated by the Sigma Rho A/D converter 10 for $V_{in}=121/229\approx0.5283242795$:

1010<u>1</u>0, 1010<u>1</u>0, 10101<u>1</u>0, 1010<u>1</u>0, 1010<u>1</u>0, 10101<u>1</u>0, 1010<u>1</u>0, 1010<u>1</u>0, 10101<u>11</u>0, 1010<u>1</u>0, 1010<u>1</u>0, 10101<u>1</u>0, 1010<u>1</u>0, 1010<u>1</u>0, 10101<u>1</u>0, 1010<u>1</u>0, 1010<u>1</u>0, 10101<u>11</u>0, 1010<u>1</u>0, 1010<u>1</u>0, 10101<u>1</u>0, 1010<u>1</u>0, 10101<u>1</u>0, 1010<u>1</u>0, 1010<u>1</u>0, 1010<u>1</u>0, 10101<u>111</u>0, then repeat from the beginning.

The following Table illustrates the two answers that would appear in the fluctuating output of the SDA 18 for various values of N:

TABLE

| N Value | Output Answer 1 | Output Answer 2 |
|---|---|---|
| 2 | .0 | .1 |
| 4 | .10 | .11 |
| 8 | .100 | .101 |
| 16 | .1000 | .1001 |
| 32 | .10000 | .10001 |
| 64 | .100001 | .100010 |
| 128 | .1000011 | .1000100 |
| 256 | .10000111 | .10001000 |
| 512 | .100001110 | .100001111 |
| 1024 | .1000011101 | .1000011110 |
| 2048 | .10000111010 | .10000111011 |
| 4096 | .100001110100 | .100001110101 |
| 8192 | .1000011101000 | .1000011101001 |

For the example of $V_{in}=121/229$ the binary answer sought is approximately 0.100001110100000001. As N increases, the bit resolution can be seen to increase as a natural consequence of a larger number of updates being accumulated (i.e., the sum will have more significant digits). The bit resolution of the Sigma Rho A/D converter 10 is given by $\log_2(N)$ and, as described earlier, the answer fluctuates between Answer 1 and Answer 2 with a pattern that, when averaged, yields the input value exactly.

For most input values, a partial bit stream cycle is accumulated and a residual charge remains on the capacitor C of the integrator 12. In accordance with an aspect of this invention, this residual charge can be used to obtain additional bit accuracy through a multi-stage Sigma Rho A/D converter approach. A number of such multi-stage architectures are possible, as detailed below.

Figure 5:
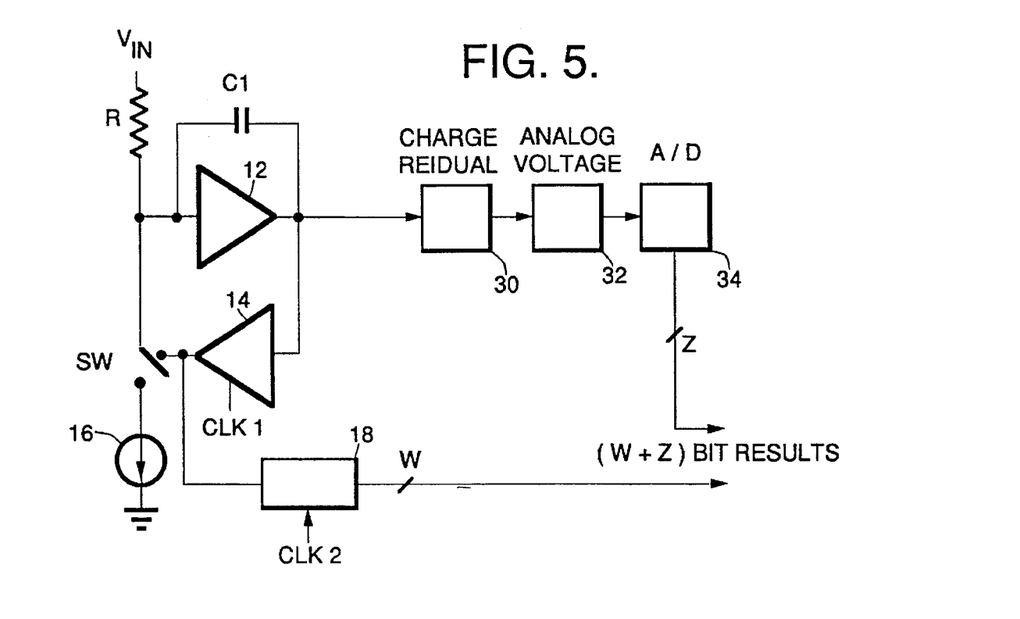
FIG. 5 is a block diagram illustrating a plurality of cascaded A/D converters in accordance with an aspect of this invention.

A two-stage Sigma Rho A/D converter architecture is illustrated in FIG. 5. The un-neutralized charge on the first stage capacitor, designated $C_1$, is analyzed by a second stage Sigma Rho A/D converter 34. The un-neutralized charge is first passed through a circuit 30 (such as a switched capacitor circuit) which extracts the charge residual from C1, and then through a circuit 32 that converts the extracted charge residual to an analog voltage to be applied to the second Sigma Rho A/D converter 34. In this example, the first stage outputs a W-bit value, the second stage outputs a Z-bit value (representing the un-neutralized residual charge of the first stage), and the two outputs are combined into a (W+Z)-bit final value. It is noted that the monotonicity of this configuration is not guaranteed. Furthermore, it is preferred to provide a delay so as to align the W and Z values in this essentially pipelined embodiment.

The two-A/D converter embodiment of FIG. 5 can be extended to n-stages, wherein each stage converts the residual charge from the preceding stage. In addition, a pipeline architecture can be employed wherein residual charge is analyzed while the next conversion is performed by another Sigma Rho A/D converter.

Figure 6A:
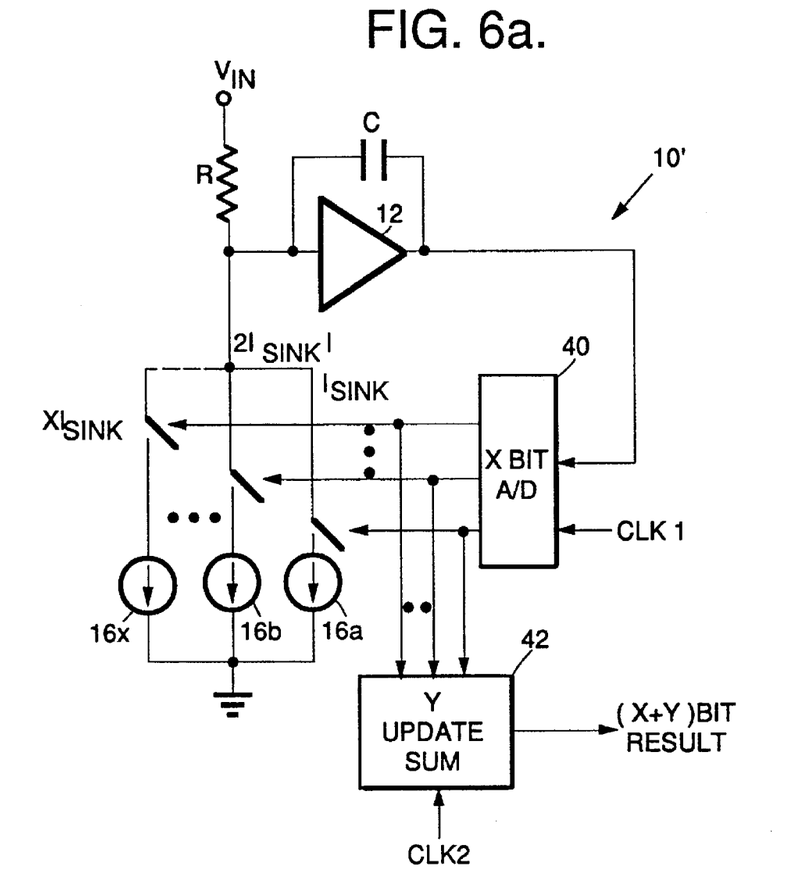
FIG. 6a illustrates a multiple-bit feedback A/D converter in accordance with an aspect of this invention.

A multiple-bit negative feedback embodiment is illustrated in FIG. 6a, wherein the 1-bit clocked comparator 14 of FIG. 1 is replaced by an X-bit clocked A/D converter 40, such as a one clock cycle flash A/D converter, and additional Y-bits of resolution are acquired by a sum and dump operation, via Y update sum device 42, to provide a total X+Y bit resolution. In this embodiment the X-bit A/D converter 40 controls the switching of $2^X$ binarily weighted current sinks 16.

Figure 6B:
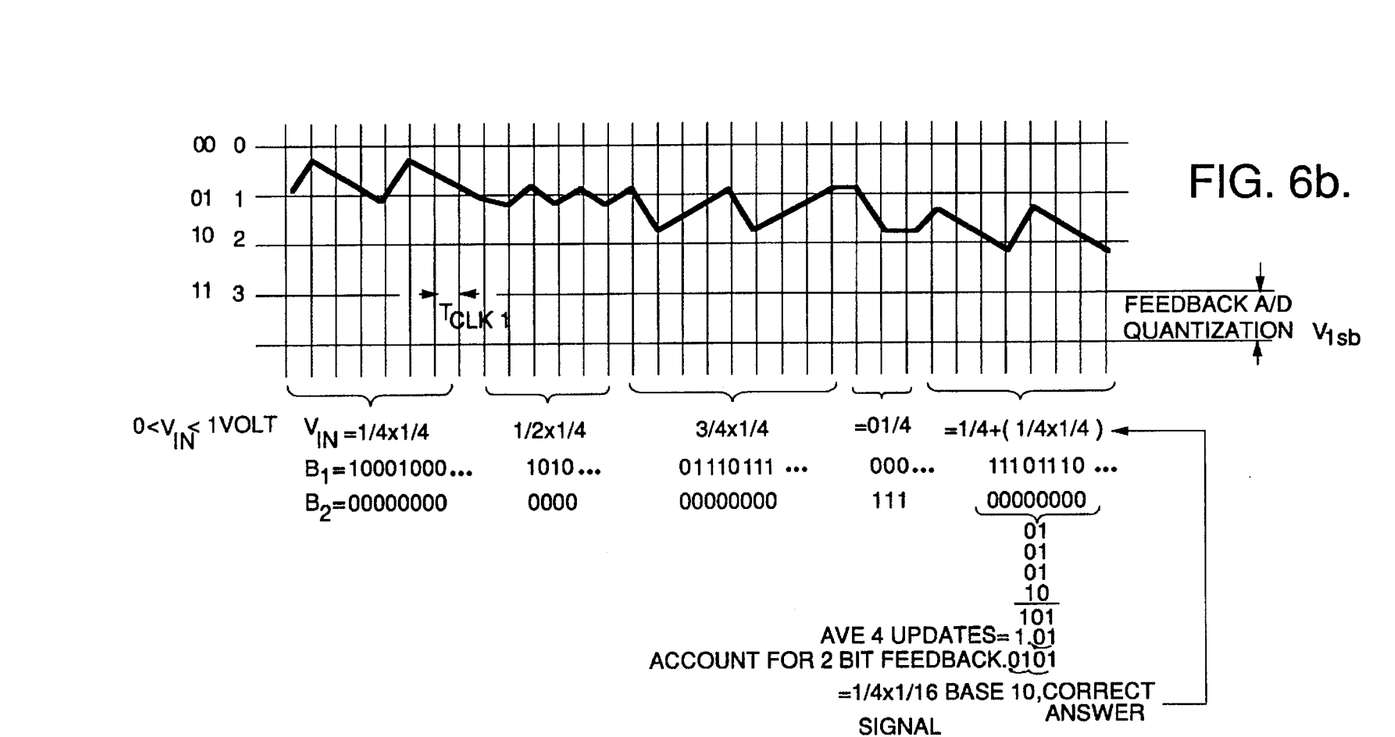

For the multi-bit Sigma Rho A/D converter embodiment of FIG. 6a the behavior of the integrator 12 may be simplified by selecting the value of C such that $C>I_{sink}/(V_{lsb}*2/T_{CLK1})$. As shown in FIG. 6b, this insures that when the input voltage is almost exactly at one quantization level of the feedback A/D, the amplitude of the integration waveform is still sufficiently small to not overlap into the neighboring quantization levels.

An important aspect of this invention is that the frequent charge neutralization allows high gain with low noise. Generally, higher gain is desirable to achieve low noise operation. The two elements affecting gain in the Sigma Rho A/D converter 10 are the value of the capacitance C, which sets the gain of the integrator 12, and the input resistor R which sets the transconductance (converting voltage to analog current). Compared to conventional dual slope-type A/Ds, the Sigma Rho A/D converter 10 provides higher integrator gain because charge is more frequently neutralized. In contrast, a conventional dual slope A/D converter, using comparable high gain (small capacitance), would generate large output voltages that would tend to saturate the integrator.

That is, the use of high frequency integration and charge neutralization enables the use of a relatively small value for the integration capacitance. As a result small charge signals can be represented while providing high noise immunity.

A further aspect of this invention is the low sensitivity of the Sigma Rho A/D converter 10 to the accuracy and stability of the components. The Sigma Rho A/D converter 10 accuracy is a function of the leakage at the input node of the integrator 12 (including the leakage of C), and upon the accuracy of the current sink 16, including the accuracy of the sink and the characteristics of SW. So long as these conditions are adequately met the Sigma Rho A/D converter 10 can accurately track the neutralization of charge representing the input signal. That is, high resolution and accuracy is obtained without requiring precision voltage comparators.

Another important aspect of the Sigma Rho A/D converter 10 is that the linearity of the integrator 12 is determined by linearities of C and the operational amplifier that comprise the integrator 12. Significantly, the Sigma Rho A/D converter 10 is generally insensitive to integrator nonlinearity because the integrator output is only used to drive the voltage comparator 14.

Another important advantage is the insensitivity of the Sigma Rho A/D converter 10 to offsets inherent in the comparator 14. Such offsets in conventional A/D converters can give rise to nonlinearity, quantization error, and nonmonotonicity. However, any comparator 14 offset error is automatically compensated during the Sigma Rho A/D converter 10 operation because any extra charge integrated due to an offset of the comparator 14 is subtracted in subsequent cycles.

Furthermore, the Sigma Rho A/D converter 10 inherently integrates the incoming signal, thereby avoiding noise folding or aliasing found in sampled data A/D designs.

Figure 7A:
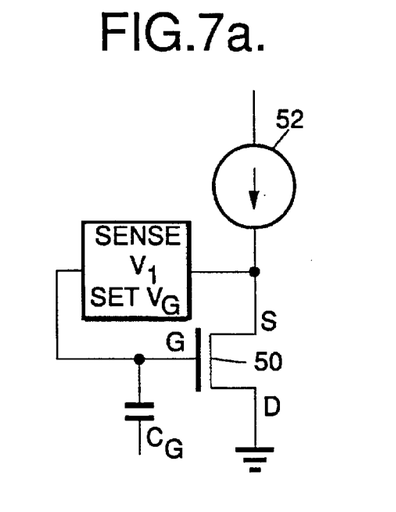
FIG. 7a illustrates a method for calibrating a current sink in accordance with an aspect of this invention.
Figure 7B:
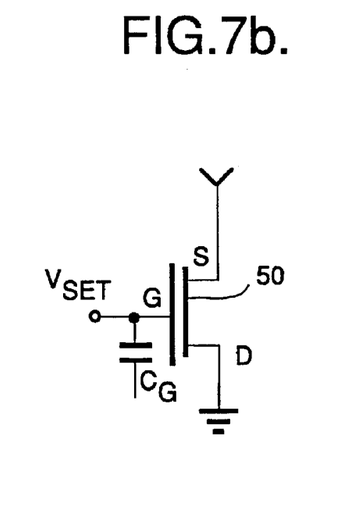
FIG. 7b illustrates a calibrated current sink as incorporated into the A/D converter.

FIG. 7a depicts the initial calibration of a current mirror 50 embodiment for the current sink 16. A known current from an external calibration source 52 is driven through the source (S) to calibrate the voltage on current mirror gate ($V_G$). As is seen in FIG. 7b, this voltage ($V_{SET}$) is held on the gate by a capacitor $C_G$ during operation.

Figure 8:
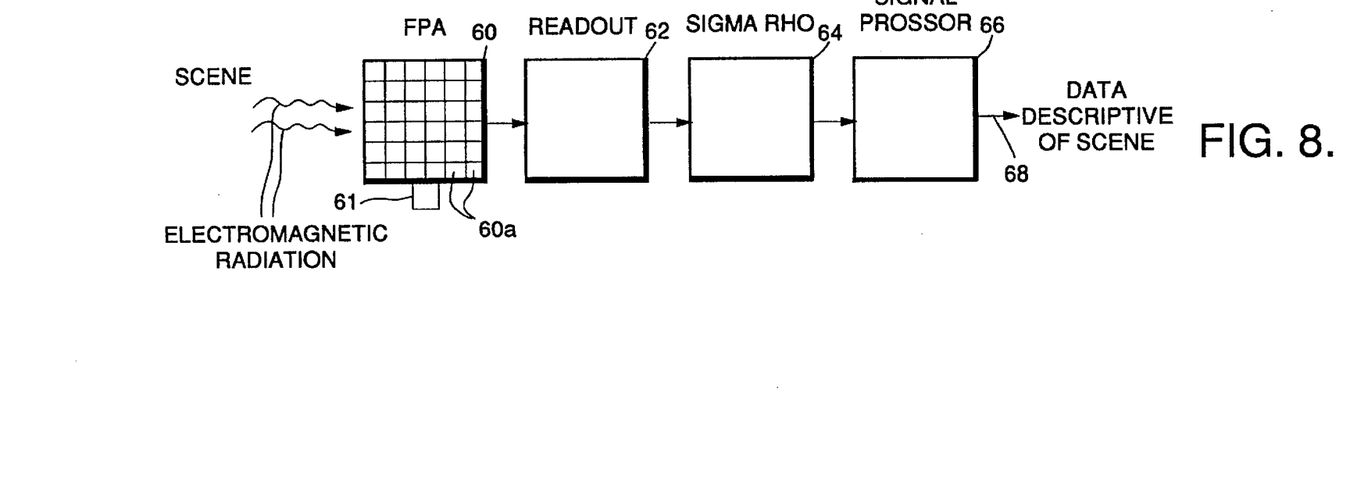
FIG. 8 is a block diagram of an exemplary imaging system that includes the A/D converter of this invention.

FIG. 8 illustrates an exemplary imaging system that is constructed and operated in accordance with this invention. Electromagnetic radiation emanating from a scene is incident on an FPA 60 comprised of a plurality of radiation detector elements or pixels 60a. By example only, the radiation may be in the infrared (IR) spectrum, and the individual pixels may be comprised of an IR-responsive Group II–VI material alloy such as HgCdTe. A cryogenic cooler 61 is employed for cooling the FPA 60 to an operating temperature and for maintaining the FPA 60 at the operating temperature. The electrical outputs of the pixels 60a of the FPA 60 are provided to a readout circuit 62 where the individual pixel signals are amplified and possibly multiplexed together into one or more streams of analog voltages. The readout circuit 62 may include an array of transimpedance amplifiers as is well known in the art. The voltages are input to a Sigma Rho A/D assembly 64 that includes one or more of the Sigma Rho A/D converters of this invention. The assembly 64 converts the magnitude of the input voltages to a digital format, as described in detail above, and provides the digital values to a signal processor 66. The processor 66 can perform the averaging function, as described above, and may also be employed for detecting patterns of digital values, and nested patterns of digital values, also as described above. An n-bit set of output signal lines can be input to the processor 66, which then derives an m-bit resolution value therefrom, where n<m, also as described above. The signal processor 66 has an output 68 providing data descriptive of the scene.

In some embodiments the readout circuits 62 and Sigma Rho assembly 64 may both be integrated into a common integrated circuit die that is coupled to, or hybridized with, the FPA 60 and, as such, may be physically located at or near the focal plane of the imaging system of which the FPA is a part.

In other embodiments of this invention the radiation may be, by example, visible radiation, ultraviolet radiation, gamma radiation, or X-rays. The detectors may also be responsive to ionizing particles, to acoustic energy, or to magnetic fields.

In general, the Sigma Rho A/D converter of this invention may be utilized in any application wherein it is desired to convert an input signal, voltage potential or current, into a digital value that is expressive of a characteristic of the input signal.

Thus, while the invention has been particularly shown and described with respect to preferred embodiments thereof, it will be understood by those skilled in the art that changes in form and details may be made therein without departing from the scope and spirit of the invention.

What is claimed is:

1. An analog to digital converter comprising:

means for integrating a charge representative of an input signal, said charge integrating means having an input for receiving the charge to be integrated and an output providing an output signal;

means, having an input coupled to said output signal, for generating at an output node, at a first rate, a digital value in response to a magnitude of the output signal;

feedback means, having an input coupled to said output node and an output coupled to said input of said charge integrating means, for selectively neutralizing and not neutralizing, in response to the digital value, the charge integrated by said charge integrating means;

means, having an input coupled to said output node, for summing the digital values output from said generating means and for outputting a sum signal at a second rate that is less than the first rate; and means, responsive to said sum signal, for averaging said sum signal.

2. An analog to digital converter as set forth in claim 1, wherein said summing means outputs said sum signal as an N-bit digital value, wherein said first rate is established by first clock signal having a frequency of f, and wherein said second rate is established by a second clock signal having a frequency of f/N.

3. An analog to digital converter as set forth in claim 1, wherein said summing means outputs said sum signal as an N-bit digital value, and wherein said averaging means includes means for dividing said N-bit digital value by shifting left a decimal point of said N-bit digital value by $\log_2(N)$ bit positions.

4. A Sigma Rho A/D converter comprising:

a transconductance element having an input node for receiving an input voltage signal $V_{in}$, said transconductance element converting the input voltage signal and outputting at an output node an analog current $I_{in}$;

a charge integrator having an input coupled to said output node, said charge integrator having feedback provided by an integrating capacitor C and an output node providing an output signal $V_o$;

a clocked voltage comparator having an input coupled to $V_o$ for comparing $V_o$ to a reference potential, an output of said comparator changing between first and second logic states in response to an occurrence of a first clock signal CLK1;

a current sink that is switchably coupled to said output node of said transconductance element, said current sink being coupled to said output node of said transconductance element when said output of said comparator is in a first logic state, said gated current sink being uncoupled to said output node of said transconductance element when said output of said comparator is in a second logic state;

a sum and dump accumulator having an input coupled to said output of said comparator and an output having N output bits, said sum and dump comparator summing together individual ones of said first logic states and outputting a sum value on said N output bits in response to an occurrence of a second clock signal CLK2;

a clock source outputting CLK1;

means for delaying CLK1; and means for dividing the delayed CLK1 by N and for outputting CLK2.

5. A Sigma Rho A/D converter as set forth in claim 4, wherein unique stream of logical states are output from said comparator in response to individual ones of different values of $V_{in}$.

6. A Sigma Rho A/D converter as set forth in claim 4, and further comprising means, responsive to an outputted sum value, for averaging the sum value.

7. A Sigma Rho A/D converter as set forth in claim 6, wherein said averaging means includes means for dividing said N-bit sum value by shifting left a decimal point of said N-bit sum value by $\log_2(N)$ bit positions.

8. A Sigma Rho A/D converter as set forth in claim 4, wherein at a time when said sum value is output said charge integrator has a residual, un-neutralized charge, and further comprising:

means for extracting the residual un-neutralized charge from said charge integrator;

means for converting the extracted charge to a corresponding voltage;

and a second Sigma Rho A/D converter having an input coupled to said corresponding voltage for generating a second sum value representative of the magnitude of the residual, un-neutralized charge.

9. A Sigma Rho A/D converter as set forth in claim 8, and further including means for combining the sum value and the second sum value as a composite sum value signal.

10. A Sigma Rho A/D converter as set forth in claim 4 wherein $V_{in}$ has a magnitude that is expressive of an amount of radiation that is absorbed by a radiation detector.

11. A Sigma Rho A/D converter as set forth in claim 10 wherein the radiation detector is disposed at a focal plane of an imaging system, and wherein the Sigma Rho A/D converter is physically located at or near the focal plane.

12. A method of converting a voltage into an N-bit digital representation of a magnitude of the voltage, said method comprising the steps of:

converting the voltage to a current;

integrating the current;

generating, at a first rate, individual ones of bits of a bit stream having a repeating and unique bit pattern for individual ones of a number of different voltage magnitudes;

selectively neutralizing and not neutralizing, in response to a logical state of each of the bits of the bit stream, the current being integrated;

summing together those bits of the bit stream that have a first logical state; and outputting the sum at a second rate that is less than the first rate, wherein the sum is expressed as an N-bit digital value, wherein the first rate is established by a first clock signal having a frequency of f, and wherein the second rate is established by a second clock signal having a frequency of f/N.

13. A method as set forth in claim 12, and further including a step of averaging the sum by dividing the N-bit digital sum value by shifting left a decimal point of the N-bit digital sum value by $\log_2(N)$ bit positions.

14. A method as set forth in claim 12, wherein the step of integrating places charge on a capacitance, wherein at a time when the sum is output a residual, un-neutralized charge remains on the capacitance, and further comprising the step of generating a second sum that is representative of the magnitude of the residual, un-neutralized charge.

15. A method as set forth in claim 14, and further comprising a step of combining the sum and the second sum as a composite sum.

16. A method as set forth in claim 12, and further comprising the steps of:

detecting a first sum value having a first bit pattern;

detecting a second sum value having a second bit pattern; and averaging the first and the second sum values to obtain a value that is representative of the magnitude of the input voltage.

17. A method as set forth in claim 16 and further including the steps of:

repetitively deriving a plurality of approximate values of the magnitude of the input voltage from each of the first and the second sum values; and subsequently deriving an exact value of the magnitude of the input voltage by the step of averaging the first and the second sum values.

18. A method as set forth in claim 12 and including a step of programmably changing a resolution of the sum by changing the value of N.

19. A method as set forth in claim 12, wherein the step of selectively neutralizing and not neutralizing includes a step of coupling and uncoupling a current sink.

20. A method as set forth in claim 19 and further comprising an initial step of calibrating the current sink to sink a predetermined amount of current.

21. A method of converting a voltage into a N-bit digital representation of a magnitude of the voltage comprising the steps of:

converting the voltage to a current;

integrating the current;

generating, at a first rate, an X-bit representation of the integrated current wherein the first rate is established by first clock signal having a frequency of f;

selectively neutralizing, in response to logical states of the X-bit representation, the current being integrated;

summing together all of the X-bit representations wherein the sum is expressed as an N-bit digital value; and outputting the sum at a second rate that is less than the first rate wherein the second rate is established by a second clock signal having a frequency of f/N.

22. A method as set forth in claim 21, and further including a step of averaging the sum by dividing the N-bit digital sum value by shifting left a decimal point of the N-bit digital sum value by $\log_2(N)$ bit positions.

23. A radiation detector assembly, comprising:

an array of radiation detector elements outputting analog signals in response to incident radiation arriving from a scene; and at least one analog to digital converter coupled to said array of radiation detector elements for converting said analog signals to digital signals, said at least one analog to digital converter comprising circuitry for generating, at a first rate, individual ones of bits of a bit stream having a repeating and unique bit pattern for representing individual ones of a number of different analog signal magnitudes, said at least one analog to digital converter further comprising circuitry for summing together bits of the bit stream that have a first logical state and for outputting a sum value at a second rate that is less than the first rate.

24. A radiation detector assembly as set forth in claim 23 and further comprising a data processor having an input coupled to said outputting circuitry for detecting a first sum value having a first bit pattern, for detecting a second sum value having a second bit pattern, and for averaging the first and the second sum values to obtain a value that is representative of the magnitude of the analog signal.

25. A radiation detector assembly as set forth in claim 23 and further comprising a data processor having an input coupled to said outputting circuitry for repetitively deriving a plurality of approximate values of the magnitude of the analog signal from each of first and the second sum values, and for subsequently deriving an exact value of the magnitude of the analog signal by averaging the first and the second sum values.

26. A radiation detector assembly as set forth in claim 25 wherein said input to said data processor expresses n bits, wherein said data processor derives said exact value to have m bits, and where n<m.

* * * * *